United States Patent [19]
Jeng

[11] Patent Number: 5,589,417
[45] Date of Patent: Dec. 31, 1996

[54] TISI$_2$/TIN CLAD INTERCONNECT TECHNOLOGY

[75] Inventor: Shin-Puu Jeng, Plano, Tex.

[73] Assignee: Texas Instruments, Incorporated, Dallas, Tex.

[21] Appl. No.: 481,665

[22] Filed: Jun. 7, 1995

Related U.S. Application Data

[62] Division of Ser. No. 369,562, Jan. 6, 1995, which is a continuation of Ser. No. 186,828, Jan. 24, 1994, abandoned, which is a continuation of Ser. No. 3,209, Jan. 12, 1993, abandoned.

[51] Int. Cl.$^6$ .................................................. H01L 21/28
[52] U.S. Cl. .......................... 437/190; 437/192; 437/200; 437/193
[58] Field of Search .................... 437/190, 192, 437/193, 200; 257/757, 764

[56] References Cited

U.S. PATENT DOCUMENTS

| | | |
|---|---|---|
| 3,777,364 | 11/1973 | Schihella et al. .............. 257/754 |
| 4,746,219 | 5/1988 | Holloway et al. .............. 257/396 |
| 4,782,380 | 11/1988 | Sankar et al. .................. 357/71 |
| 4,804,636 | 2/1989 | Groover, III et al. ............ 437/52 |
| 4,814,854 | 3/1989 | Tigelaar et al. ................ 257/900 |
| 4,962,414 | 10/1990 | Liou et al. ..................... 357/71 |
| 4,975,756 | 12/1990 | Haken et al. ................... 357/4.1 |
| 5,091,763 | 2/1992 | Sanchez ........................ 357/23.9 |
| 5,168,076 | 12/1992 | Godinho et al. ................ 437/60 |
| 5,173,450 | 12/1992 | Wei ............................. 437/200 |
| 5,366,928 | 11/1994 | Wolters ........................ 437/192 |
| 5,387,535 | 2/1995 | Wilmsmeyer .................... 437/57 |
| 5,403,759 | 4/1995 | Havermann ..................... 437/200 |

*Primary Examiner*—George Fourson
*Assistant Examiner*—Thomas G. Bilodeau
*Attorney, Agent, or Firm*—Jacqueline J. Garner; Wade James Brady, III; Richard L. Donaldson

[57] ABSTRACT

A TiSi$_2$/TiN clad LI strap process and structure are disclosed which combine the advantages of both TiSi$_2$ and TiN LI processes. According to the invention, the retention of a thin TiN layer between the local interconnect and contacts provides a diffusion barrier against counterdoping and relaxes the thermal budget for subsequent processing.

8 Claims, 3 Drawing Sheets

TISI$_2$/TIN CLAD INTERCONNECT TECHNOLOGY

This is a divisional of application Ser. No. 08/369,562; filed Jan. 6, 1995; which was a continuation of Ser. No. 08/186,828 filed Jan. 24, 1994 abandoned; which was a continuation of Ser. No. 08/003,209 filed Jan. 12, 1993 abandoned.

BACKGROUND OF THE INVENTION

The use of local interconnect (LI) for connecting poly gates and emitters to diffusion areas and for connecting N+ and P+ across field oxide regions allow an increased packing density for submicron VLSI circuits and a reduction in parasitic junction capacitance. See *Titanium Nitride Local Interconnect Technology* for VLSI by T. Tang, C. C. Wei, R. A. Haken, T. C. Holloway, L. R. Hite and T. G. W. Blake, IEEE Trans. Electron Devices, Vol. ED-34, 3 (1987) p. 682. TiN has been used as an LI. However, TiN is very difficult to etch without damaging a silicide layer on a substrate.

Both TiN and TiSi$_2$ LI structures have been developed which are compatible with a self-aligned silicide, or salicide, process. See *HPSAC-Silicided Amorphous Silicon Contact and Interconnect* for VLSI by D. C. Chen, S. Wong, P. V. Voorde, P. Merchant, T. R. Cass, J. Amano, and K. Y. Chiu, IEDM Tech. Dig., (1984) p. 118 and *New Device Interconnect Scheme for Submicron VLSI* by S. Wong, D. Chen, P. Merchant, T. Cass, J. Amano, and K. Y. Chiu, IEEE Trans. Electron Devices, Vol. ED-34, 3 (1987) p. 587. The original process for TiSi$_2$ LI begins with deposition of an amorphous silicon layer onto titanium. The Si layer is photographically defined and etched. Annealing in N$_2$ causes the remaining Si to react with the underlying Ti to form TiSi$_2$, while exposed Ti regions react with the ambient N$_2$ to form TiN. The TiN is then selectively removed with an H$_2$SO$_4$+H$_2$O$_2$ solution. In the original process, both contacts and LI are formed simultaneously. Because a high selectivity to Ti as between Ti and Si can be achieved by dry etching in a fluorine-based chemistry, this process has an etch advantage over the standard TiN LI process, which exhibits less selectivity to the salicided substrate. However, there are two major disadvantages of this process: namely, thermal diffusion of substrate Si into the overlying titanium layer can lead to pitting of the substrate, and counterdoping between P+ and N+ regions may occur through the LI strap during both silicide formation and subsequent high temperature processing since phosphorous diffuses rapidly in TiSi$_2$. The invention's new TiSi$_2$ clad LI structure was developed to overcome these problems.

SUMMARY OF THE INVENTION

A local interconnect (LI) technology using a novel clad TiSi$_2$/TiN structure has been developed for submicron VLSI devices. TiSi$_2$ interconnect straps are formed by reaction of a silicon-on-titanium bilayer. A thin TiN layer between the silicide strap and previously salicided regions provides an effective diffusion barrier against counterdoping and substrate silicon outdiffusion. The excellent dry etch selectivity between Si and Ti simplifies the LI patterning process. The new LI structure also offers improved electrical performance over the standard TiN LI because of its lower electrical resistance.

DETAILED DESCRIPTION OF THE INVENTION

Figure 1:
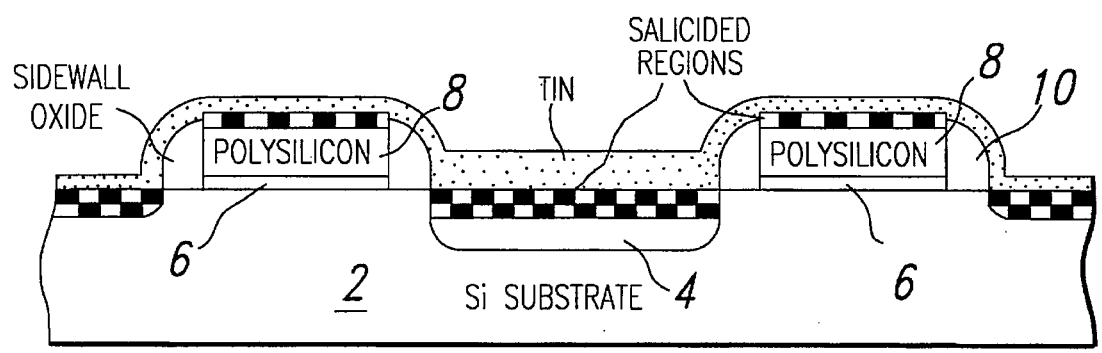
FIGS. 1 through 4 illustrate cross-sectional drawings of the in-process formation of the local interconnect according to the invention.

The invention provides a novel TiSi$_2$/TiN clad local interconnect technology which can be fabricated according to a double Ti deposition sequence. With reference to FIG. 1 which illustrates a cross-section drawing of the in-process formation of the local interconnect, a diffusion region 4 is formed in silicon substrate 2. A thin oxide is grown over substrate 2 and polysilicon is deposited overall. The polysilicon is patterned and etched along with the oxide to form gate oxide 6 and poly gate 8 as shown. Next, sidewall oxide 10 for the gates are formed by depositing a thick oxide region overall and anisotropically etching the oxide away to leave sidewall filaments. A conductive refractory metal such as Ti is then deposited overall. Like the original TiSi$_2$ LI process, an anneal is performed in ambient N$_2$ which leads to silicidation of the silicon and titanium at the silicon/titanium interfaces and leads to a first barrier metal region or layer such as TiN being formed at the surface of the exposed Ti.

Figure 2:
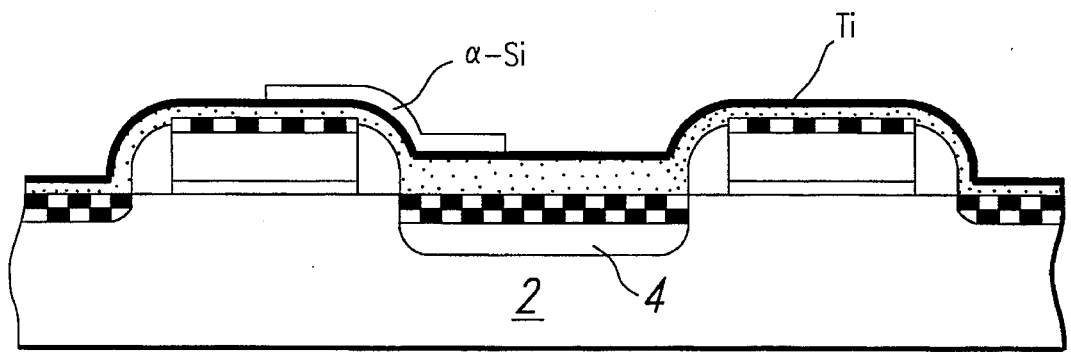

With reference to FIG. 2 which illustrates a cross-sectional view of the inprocess formation of the local interconnect, a second refractory metal layer which is conductive such as a second layer of titanium is deposited overall followed by the deposition of an amorphous silicon layer ($\alpha$-Si), resulting in a Si/Ti bilayer. The amorphous silicon layer is then patterned and dry etched using a fluorine-based chemistry.

Figure 3:
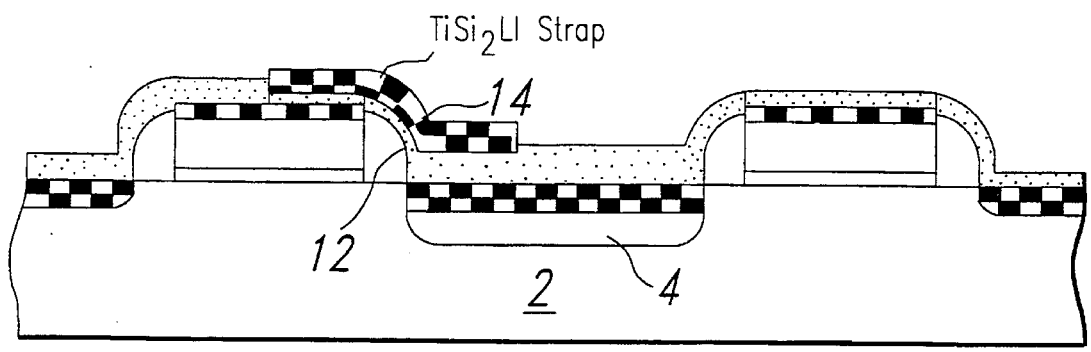

With reference to FIG. 3 which illustrates a cross-sectional view of local interconnect undergoing further processing, annealing the structure undergoing processing in N$_2$ leads to silicidation of the Si/Ti regions while the exposed Ti forms TiN. The resulting interconnect strap geometry results in a thin barrier layer such as TiN layer 12 under a conducting layer strap like TiSi$_2$ strap 14.

Figure 4:
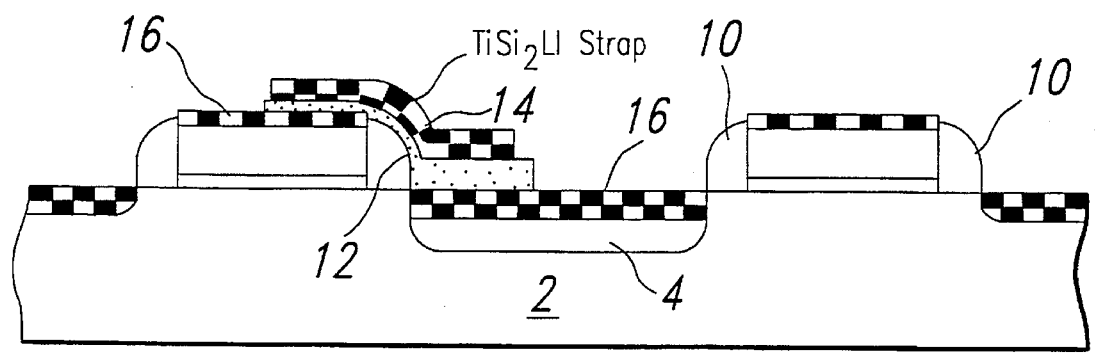
Figure 5:
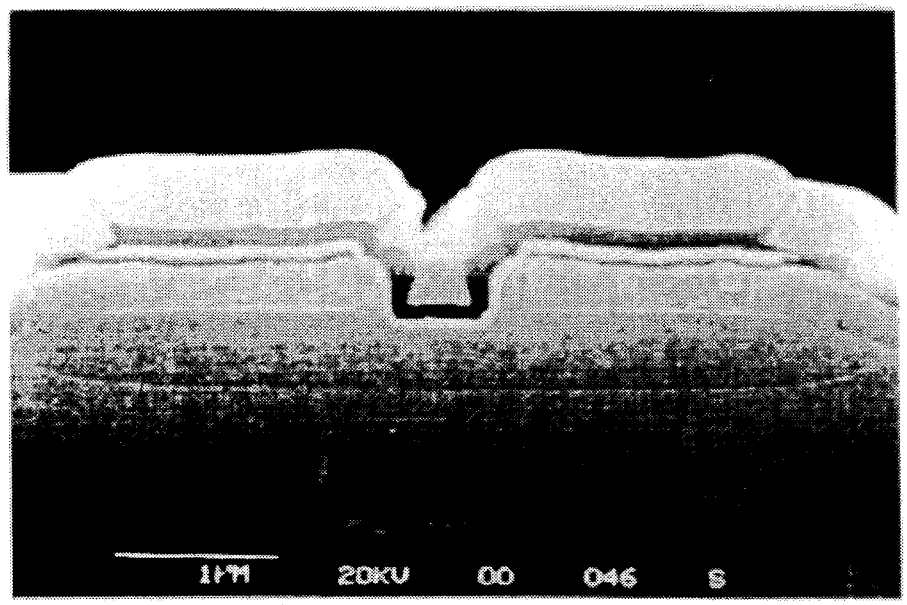
FIG. 5 illustrates a SEM cross-section of a TiSi$_2$/TiN clad LI.

With reference to FIG. 4 which illustrates a cross-sectional view of the in-process formation of the local interconnect, the unprotected region of TiN are subsequently removed by a wet strip. As shown in the SEM picture of a cross-section of the TiSi$_2$/TiN dad LI of FIG. 5, no undercutting of the TiN layer is observed after the wet strip process. In fact, as shown in both FIGS. 4 and 5, the TiN layer extends slightly beyond the overlying TiSi$_2$ layer. While the exact mechanism for this phenomenon has not been identified, it is believed to result from impurity diffusion from the Si/Ti bilayer into the underlying TiN film during silicidation. The diffusion of impurities may chemically modify the TiN layer such that it resists dissolution during the TiN wet strip process. The excellent adhesion between the upper level TiSi$_2$ and the TiN layer may also provide enhanced resistance to undercutting. Following the wet strip process, a high temperature anneal is performed to reduce the TiSi$_2$ and TiN sheet resistivities. In the original TiSi$_2$ LI process, the Si/Ti reaction occurs on both Si and SiO$_2$ substrates; since Ti will react more with Si than with SiO$_2$, it is difficult to optimize the Si/Ti ratio. In the invention's new TiSi$_2$/TiN process, the Ti reaction with the substrate is prevented by the TiN barrier layer, thus Si/Ti ratio is determined by the thickness of Si and Ti within the bilayer.

Prior art TiN LI's are fabricated from a TiN layer formed during salicidation. A two step wet/dry process is used to pattern the TiN LI. Although this process does not require any deposition steps other that the first Ti layer, the dry etching of TiN has poor selectivity to the substrate. In the invention's $TiSi_2$/TiN process, not only is the excellent dry etch selectivity of the original $TiSi_2$ process retained, but there is minimal loss of substrate from the wet etch. Because the salicided contacts are not degraded during the wet etch process, excellent contact resistance results can be achieved. The clad $TiSi_2$ layer can be regarded as an electrically conductive hard mask for the wet TiN strip process. A comparison of typical parametric data for both $TiSi_2$/TiN clad LI and TiN LI is shown in table 1. Fifty test structures were subjected to measurement and average values are indicated in table 1. Note that throughout table 1, the standard deviation (sig., short for sigma) of each set of fifty measurements is indicated within parentheses. As shown in table 1, 3000 LI's were constructed (referred to as an LI chain) and the ohms per strap were measured for both the TiN LI strap and the $TiSi_2$/TiN LI strap of the invention. Significantly lower resistances were measured for the invention's LIs regardless of whether these straps were constructed over N+ doped diffusions (N+ chain), P+ doped diffusions (P+ chain) or over two poly regions (PLY chain). LI serving as resistors can be distinguished generally by their relatively long length in comparison with non-resistor LIs. Ohms per square measurements are indicated in table 1 for LI resistors measuring 150 μm by 0.8 μm and for LI resistors measuring 150 μm by 1.2 μm. Note that a topography resistor can be constructed according to the invention by placing an LI resistor strap over a composite comprising poly moat, sidewall oxide and the like. Measurements for LI topography resistors measuring 150 μm by 0.8 μm are indicated in table 1.

TABLE 1

PARAMETRIC COMPARISON OF TiN AND $TiSi_2$/TiN LI

| Parameter | TiN LI (sig.) | $TiSi_2$/TiN LI | Units |
|---|---|---|---|
| 3000 LI-N+ Chain | 107.8 (8.6) | 25.5 (1.7) | ohm/strap |
| 3000 LI-P+ Chain | 84.0 (6.3) | 21.4 (1.3) | ohm/strap |
| 3000 LI-PLY Chain | 126.6 (12.0) | 39.8 (3.1) | ohm/strap |
| 150 μm × 0.8μ LI Resistor | 17.9 (1.6) | 2.2 (0.2) | ohm/square |
| 150 μm × 1.2 μm LI Resistor | 14.5 (1.1) | 1.8 (0.1) | ohm/square |
| 150 μm × 0.8 μm LI topo Resistor | 32.6 (4.2) | 10.5 (0.9) | ohm/square |

The invention's $TiSi_2$/TiN clad process combines the advantages of both the $TiSi_2$ and the TiN LI processes. The large dry etch selectivity between Si and Ti for the $TiSi_2$ process is retained. The retention of a thin TiN layer between the interconnect and the contacts provides a diffusion barrier against counterdoping of phosphorous, which relaxes the thermal budget (thermal budget being a function of temperature multiplied by time) for subsequent processing (i.e., the invention allows higher temperature processing over longer times). The clad $TiSi_2$ layer can be regarded as an electrically conductive hard mask for a wet TiN strip process. Improved electrical characteristics result from the intrinsically lower resistivity of $TiSi_2$ as compared to TiN.

I claim:

1. A process for forming a local interconnect comprising:

depositing a refractory metal layer over a substrate which includes silicon;

annealing the structure thus formed by the foregoing process step in a first ambient gas so as to form a first barrier metal material adjacent a first silicide region;

depositing a refractory metal on said first barrier metal material;

depositing silicon on said refractory metal deposited on said first barrier metal material;

annealing the structure thus formed by the foregoing process steps in a second ambient gas so as to form a second barrier metal material adjacent a conductive region; and substantially etching away exposed regions of said first and said second barrier metal materials.

2. A process as recited in claim 1 wherein said deposited silicon is selected from the group consisting of amorphous silicon, polycrystalline silicon or a combination thereof.

3. A process as recited in claim 1 wherein said first barrier metal material comprises TiN.

4. A process as recited in claim 1 wherein said first silicide region comprises $TiSi_2$.

5. A process as recited in claim 1 wherein said conductive region comprises $TiSi_2$.

6. A process as recited in claim 1 wherein said first and second ambient gases are $N_2$.

7. A process for forming a local interconnect comprising:

depositing a first titanium layer over a substrate that includes silicon;

annealing the structure thus formed by the foregoing process step in ambient $N_2$ so as to form a first TiN region abutting a first $TiSi_2$ region;

depositing a second titanium layer on said first TiN region;

depositing silicon on said second titanium layer deposited on said first TiN region;

annealing the structure thus formed by the foregoing process steps in ambient $N_2$ so as to form a second TiN region abutting a second $TiSi_2$ region; and substantially etching away exposed regions of TiN.

8. A process as recited in claim 7 wherein said deposited silicon is amorphous silicon.

* * * * *